United States Patent [19]
Förster

[11] 4,177,393
[45] Dec. 4, 1979

[54] DRIVE CIRCUIT FOR A TELEVISION DEFLECTION OUTPUT TRANSISTOR

[75] Inventor: Gerhard Förster, Würenlos, Switzerland

[73] Assignee: RCA Corporation, New York, N.Y.

[21] Appl. No.: 862,386

[22] Filed: Dec. 20, 1977

[30] Foreign Application Priority Data

Dec. 20, 1976 [GB] United Kingdom ............... 53174/76

[51] Int. Cl.² ...................... H03K 17/00; H03B 41/00
[52] U.S. Cl. .................................... 307/270; 307/280; 307/300; 315/408
[58] Field of Search ................ 315/169 TV, 405, 408; 307/300, 270, 280

[56] References Cited

U.S. PATENT DOCUMENTS

| | | | |
|---|---|---|---|
| 3,706,023 | 12/1972 | Yamada et al. ............... | 315/169 TV |
| 3,757,144 | 9/1973 | Hetterscheid et al. .............. | 307/280 |
| 3,805,094 | 4/1974 | Orlando ................................. | 307/270 |
| 4,079,290 | 3/1978 | Trushell ........................... | 315/169 TV |
| 4,099,072 | 7/1978 | Lee et al. ............................. | 307/270 |

Primary Examiner—Stanley D. Miller, Jr.
Assistant Examiner—B. P. Davis
Attorney, Agent, or Firm—Eugene M. Whitacre; Paul J. Rasmussen; William H. Meise

[57] ABSTRACT

A drive circuit for a television deflection output transistor includes a drive transformer, the secondary winding of which is coupled across the base-emitter junction of the output transistor. A first end of the primary winding of the drive transformer is coupled to a driver transistor which is switched at the deflection rate. The second end of the primary winding is coupled to a first capacitor charged through a first charging resistance from a first voltage source, the magnitude of which is determined by the charge storage in the base region of the output transistor, and its current gain. The second end of the primary winding is also coupled through a diode to a second capacitor charged through a second resistor from a second voltage source. The magnitude of the second voltage source is selected at a value significantly lower than that of the first voltage source, which value is established based upon considerations of the forward base-emitter drive current required by the output transistor.

9 Claims, 5 Drawing Figures

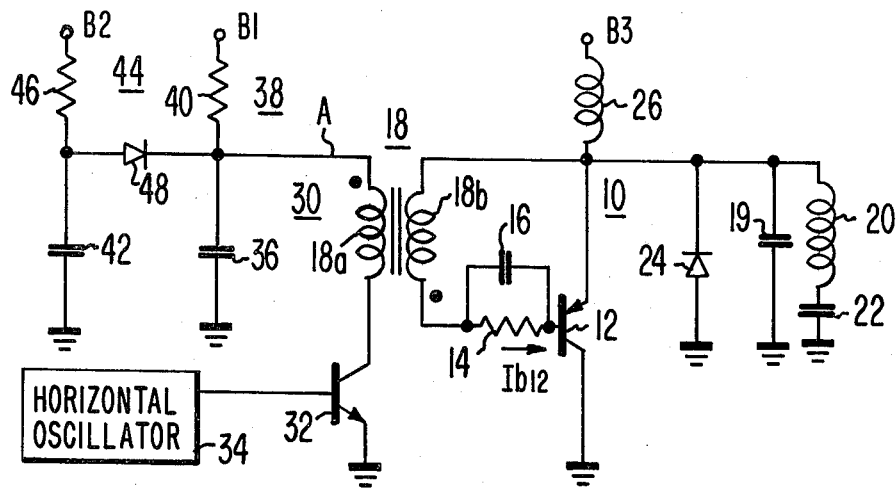
Fig.1
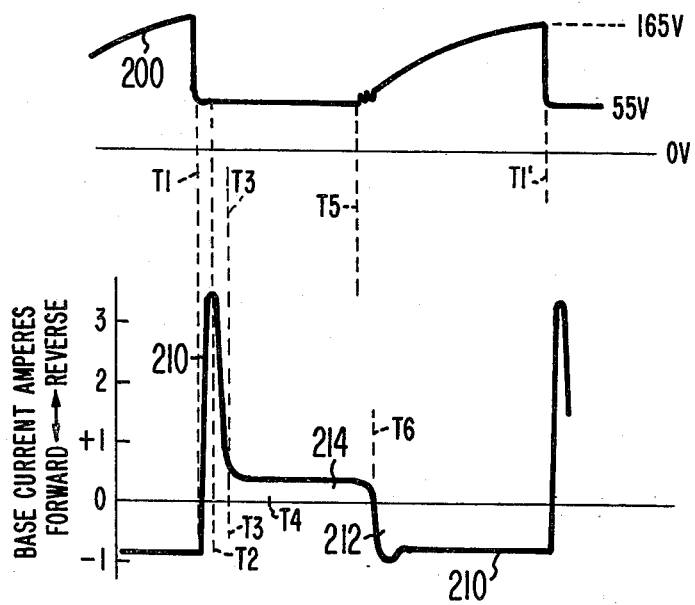
Fig.2a
Fig.2b
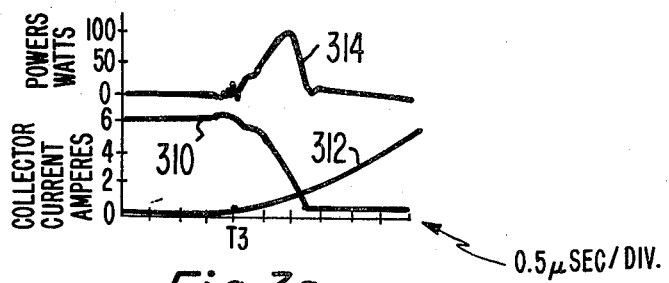
Fig.3a
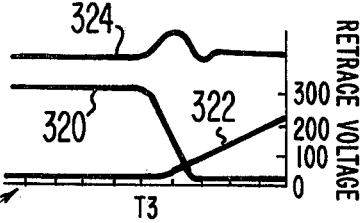
Fig.3b

DRIVE CIRCUIT FOR A TELEVISION DEFLECTION OUTPUT TRANSISTOR

BACKGROUND OF THE INVENTION

This invention relates to power transistor drive circuits.

With the advent of wide-angle, large-screen television kinescopes, the amount of deflection power handled by the deflection circuits has increased considerably.

As a result, the horizontal output transistor is highly stressed and is therefore subject to premature failure. In order to reduce the thermal stresses on the horizontal output transistor, it is normally operated in a switched mode rather than in a linear mode. Switched operation reduces the power dissipated in the transistor and the temperature rise resulting from the dissipation. Generally speaking, the faster the horizontal output transistor can be switched, the less power is dissipated in the transistor during each switching cycle. Attempts to increase the switching speed of the transistor encounter the storage of charge carriers in the base region as a limitation. The transistor continues to conduct until reverse bias is applied to the base-emitter junction with a magnitude and for a period of time sufficient to sweep the base region free of stored charge carriers.

In order to provide an initial peak in the reverse bias current to minimize the time required to sweep the charge carriers from the base region of the output transistor, it is customary to use a transformer to couple a driver transistor to the output transistor. One consideration is that the peak value of the reverse-biasing drive signal portion cannot be maintained as bias after the output transistor turns OFF, because the power dissipated in the base-emitter region would be significantly and undesirably increased, and thereby offset the desired reduction of power dissipated in the output transistor. Therefore, the reverse bias after initial turn-off of the output transistor must be below the peak value.

An improved arrangement for decreasing the turn-off time of the horizontal output transistor is described in U.S. Pat. No. 3,302,033 issued on Jan. 31, 1967 in the name of H. C. Goodrich. This arrangement uses pulse-forming networks in conjunction with a transformer to provide the output stage with a reverse-bias pulse of suitable magnitude during the initial portion of the turn-off interval as well as with suitable magnitude during the remainder of the reverse bias interval.

The use of multiple pulse-forming networks is described in an article "Design Factors for Transistorized Television Deflection Circuits" by C. Frank Wheatley, Jr., published in the IEEE Transactions on Broadcast and Television Receivers, July, 1963, pages 72 to 80. In the arrangement of this article, two resistance-capacitance pulse-forming networks charged from a single voltage source are coupled together by a diode, and the drive transformer is energized by the coupled networks when the driver transistor goes ON. This circuit provides even more drive circuit design flexibility for providing the large value of the peak output transistor reverse base current pulse, together with a relatively small reverse current thereafter, for reduced output transistor dissipation and reduced drive power.

The drive transformer is an alternating-current coupling mechanism, and therefore the total charge flow in the secondary winding during the reverse-bias condition of the output transistor must equal the total charge flow during the forward-bias interval, which is to say during the second half of the trace interval. It has been discovered that it is not possible to specify the optimum peak value of the reverse bias current independently of the magnitude of the optimum remaining reverse-bias and forward-bias currents with the prior art arrangement because the resistance-capacitance values should provide the proper time constants for drive pulse waveshaping as well.

SUMMARY OF THE INVENTION

A drive circuit for a kinescope deflection output transistor includes a drive transformer having a secondary winding coupled with the base-emitter junction of the output transistor. The primary winding of the drive transformer is coupled in series with a driver switch to form a switched winding having first and second electrodes. A first capacitor is coupled to the first and second electrodes of the switched winding, and is charged through a first resistance from a first voltage source. A second capacitor is coupled across the first by way of a unidirectional conducting device. The second capacitor is charged through a second resistor from a second voltage source having a voltage substantially less than that of the first source.

DESCRIPTION OF THE DRAWING

FIG. 1 is a diagram in block and schematic form of a horizontal deflection circuit embodying the invention; and FIGS. 2a, 2b, 3a and 3b illustrates amplitude-time characteristics of electrical parameters of the arrangement of FIG. 1 during operation.

DESCRIPTION OF THE INVENTION

Generally speaking, FIG. 1 shows a horizontal output circuit designated generally as 10 driven by a driver stage designated generally as 30. Output stage 10 includes an output transistor 12 having its collector connected to ground. The base of transistor 12 is coupled by way of a resistor 14 and parallel capacitor 16 to one end of a secondary winding 18b of a drive transformer 18. The other end of winding 18b is coupled to the emitter of transistor 12.

The emitter of transistor 12 is coupled to one end of a deflection winding 20, the other end of which is connected to ground by way of a series-connected S-shaping capacitor 22. A damper diode 24 has its cathode connected to the emitter of transistor 12 and its anode coupled to ground. The emitter of transistor 12 is coupled to a source of operating potential B3 by an inductor 26 which usually is the primary winding of the horizontal output transistor.

Driver 30 includes a driver transistor 32 having its emitter coupled to ground and its collector coupled to one end of the primary winding 18a of transformer 18. The base of transistor 32 is coupled to a horizontal oscillator 34 and driven therefrom by horizontal-rate pulses synchronized with a source of horizontal synchronization pulses, not shown. The end of winding 18a remote from the collector of transistor 32 is coupled over a conductor A to one end of a pulse-forming capacitor 36, the other end of which is connected to ground. Capacitor 36 receives charging current from a source of energy designated generally as 38 and including a low-impedance relatively high voltage source B1 and series-connected resistor 40.

An energy-storing capacitor 42 has one end connected to ground and the other end connected to an energizing source designated generally as 44 and including a source of relatively low voltage operating potential B2 and a resistor 46. The junction of energizing source 44 and capacitor 42 is coupled to the anode of a diode 48, the cathode of which is coupled to point A.

In operation during the last half of the horizontal trace interval (prior to time T1), transistor 32 is nonconductive or OFF and the voltage on conductor A is rising with a time constant dependent upon capacitor 36 and resistor 40 towards the voltage at B1, as shown by voltage waveform 200 in FIG. 2a. At this time, energy previously stored in the inductance of transformer 18 is being discharged into the base-emitter junction of transistor 12 as forward base current, as shown by the negative-going portions of waveform 210 of FIG. 2b. Conventional current is flowing from source B3 through inductor 26 and the emitter-collector junction of transistor 12 to ground. Similarly, conventional current is flowing through deflection winding 20 and the emitter-collector path of transistor 12 to ground, and the currents in winding 20 and inductor 26 are both increasing with time under the impetus of their respective driving voltages. Also prior to time T1, capacitor 42 is charged to substantially the voltage of source B2.

At time T1, prior to initiation of the horizontal retrace interval, horizontal oscillator 34 produces a positive-going pulse which causes driver transistor 32 to conduct in saturation. This connects the lower end of primary winding 18a directly to ground, and the relatively high voltage on capacitor 36 causes a resonant increase in the current flowing in winding 18a, as can be seen by transformed current waveform 210 of FIG. 2b. As current flows in winding 18a, charge is transferred out of capacitor 36, and the voltage on conductor A drops sharply as shown by waveform 200 of FIG. 2a. At some time such as T2, the decreasing voltage across capacitor 36 equals that stored on capacitor 42, and diode 48 then becomes conductive, clamping the voltage at point A to the voltage on capacitor 42 minus the forward voltage drop across diode 48.

The current flowing in the inductance associated with primary winding 18a decreases in the interval between times T2 and T3 to a value which can be maintained by the constant voltage. As transformed to the secondary side, the current decreases from a peak value of approximately 3½ amperes to approximately 400 milliamperes, which current is maintained substantially constant until a later time T5. The flow of current in the windings of transformer 18 during the interval T2–T3 progressively increases the energy stored in the transformer inductance.

At time T3, substantially all the charge carriers stored in the base region of transistor 12 have been removed by the flow of reverse current in the interval T1 to T3, and the transistor becomes nonconductive to begin the retrace interval. During the retrace interval, extending from time T3 to T4, a later time such as transistor 12 is nonconductive, and the current flow in inductors 20 and 26 decreases as the inductors resonate with their stray capacitances, and retrace capacitor 19 producing a high peak positive voltage which ultimately causes a reversal of the current direction in windings 20 and 26. At the end of the retrace interval, damper diode 24 becomes conductive and provides a path by which the energy stored in winding 20 can be discharged as current flow through S-capacitor 22. Damper 24 also provides a path by which energy stored in inductor 26 can be returned as current flow to source B3.

During the first half of the following trace interval, extending from T4 to a time near T6, damper diode 24 remains conductive and transistor 12 is maintained nonconductive by reverse current flow through its base-emitter junction. This reverse base current results from the application at point A of the substantially constant voltage of capacitor 42. During this interval of current flow, the stored energy in transformer 18 continues to increase.

Near time T5, the energy stored in transformer 18 reaches a maximum, and the energy stored as current in deflection winding 20 approaches zero as capacitor 22 reaches its maximum charge. At time T5, a negative-going pulse is applied to the base of transistor 32, turning it OFF. This prevents further current flow through primary winding 18a. The self-inductance of transformer 18 may be viewed as being an inductance connected in parallel with winding 18a, through which a portion of the driver transistor 32 current flows in the interval T1 to T5.

When driver transistor 32 is rendered nonconductive, the energy stored in the self-inductance provides a voltage tending to make windings 18a and 18b sources having a negative polarity at the dotted ends. The negative-going voltage at the dotted end of winding 18b causes transistor 12 to become biased for forward conduction in a saturated mode before the center of the trace interval. After the center of the trace interval the currents in deflection winding 20 and inductor 26 once again begin to increase and flow through the emitter-to-collector path of transistor 12, as described previously.

Since transformer 18 is an AC coupling device, the area 212 included in the negative-going portions of waveform 210 between times T6 and T1' must equal the area 214 under the positive-going portions of curve 210 in the interval from T1 to T6. Transistor 12 at the end of the trace interval has a maximum current flowing, and has a minimum beta, which, for example, may be as low as two. Sufficient energy must be stored in transformer 18 in the interval between T1 and T6 to provide the desired output transistor base current immediately prior to time T1'. However, the forward base current of the output transistor at time T1' should not be too great, because this causes an increase in the storage of charge carriers in the base region of the transistor. Thus, the magnitude of area 212 is established based upon known circuit and transistor parameters.

Similarly, the peak value of the current pulse in the interval between times T1 and T3 is determined by the charge stored in the base region of the output transistor, and is adjusted by the parameters of energizing source 38 to minimize the output transistor turn-off time. As the area under curve 210 in the interval between T1 and T3 is controlled to optimize the turn-off time, however, area 214 changes and as a consequence area 212 also changes, thereby varying the saturation and charge storage at and immediately prior to time T1' in an undesirable manner. In order to allow independent control of the output transistor forward base current at time T1' and the peak reverse current at time T2, the magnitude of the output transistor reverse base current in the interval T3 to T6 must be controlled. This control is accomplished by means of energizing source 44, by which the voltage at conductor A during the interval T3 to T5 may be varied. By this, the necessity for excess reverse current in the interval T3 to T6 and a resulting excess output transistor power dissipation is avoided.

The use of the two separate relatively high and low voltage sources B1 and B2 allows greater flexibility in the design of the drive circuit for providing optimum drive conditions for output transistor 12. The relatively high voltage source B1 enables a relatively small value of capacitor 36 to be selected compared to the prior art. A smaller capacitor 36 value permits a very fast discharge time constant which is often desired for the initial turn-off drive signal for the output transistor to minimize dissipation in the transistor. At the same time the high supply voltage B1 allows enough energy storage in spite of the small capacitance.

Additionally, the discharge time constant of capacitor 36 is partly determined by the value of resistor 40 because the filter capacitor usually associated with the voltage source B1 is in parallel with capacitor 36 through resistor 40. Thus, the higher the value of resistance 40, the lower the effective increase in capacitance. Again, the use of a relatively high voltage source B1 permits the use of a resistance 40 which is substantially larger than in the prior art.

The use of the relatively low second voltage source B2, used to charge capacitor 42, complements the advantages of the first part of the circuit because it can be selected, along with resistor 44 and capacitor 42, to provide the proper turn-off drive signal following the initial pulse as well as to control the energy stored in transformer 18 which in turn provides forward drive to the output transistor as described above.

FIGS. 3a and 3b illustrates the improvement in turn-off performance resulting from the use of two separate and different voltage sources to energize the driver stage. In FIG. 3a, the output transistor current in the vicinity of time T3 is shown as waveform 310, the retrace voltage as waveform 312 and the instantaneous power dissipation as 314. As can be seen from waveform 310, turn-off of the output transistor takes place in approximately 1.3 microseconds, and the resulting power dissipation has a peak value of 100 watts. In FIG. 3b, waveform 320 similarly illustrated the collector current of the output transistor with energizing source 38 modified with a higher voltage for source B1. The corresponding retrace voltage is illustrated as waveform 322, and the instantaneous power as waveform 324. It may be observed that the turn-off time of the output transistor has been reduced and the peak power is significantly lower than in the case of FIG. 3a.

In the particular application to which the waveforms of FIG. 2 are applicable, the following component values were found to be suitable:

B1—280 volts
B2—55 volts
R1—6800 ohms
R2—50 ohms
C1—5.6 nF
C2—0.56 μF

What is claimed is:

1. A drive circuit for a kinescope deflection output transistor, comprising:
   drive transformer means including a secondary winding coupled with a base-emitter junction of the output transistor and also including a primary winding;
   driver switch means serially coupled with said primary winding of said drive transformer means thereby forming a switched winding;
   first energy storage means coupled to said switched winding;
   a first source of energizing potential coupled to said first energy storage means for energy charging thereof;
   second energy storage means;
   unidirectional current conducting means coupled to said first and second energy storage means for providing energy flow therebetween;
   a second source of energizing potential coupled to said second energy storage means for energy charging thereof, said second source of potential having a magnitude substantially less than that of said first.

2. A drive circuit for a kinescope deflection output transistor in accordance with claim 1, wherein said driver switch means comprises a switching transistor operated at the deflection rate.

3. A drive circuit for a kinescope deflection output transistor in accordance with claim 1, wherein said first energy storage means comprises first capacitance means, and said first source of energizing potential is coupled to said first capacitance means by first resistance means.

4. A drive circuit for a kinescope deflection output transistor in accordance with claim 1, wherein said second energy storage means comprises capacitance means, and said second source of energizing potential is coupled to said capacitance means by resistance means.

5. A drive circuit for a kinescope deflection output transistor in accordance with claim 1, wherein said first and second energy storage means comprise first and second capacitance means, and said first and second sources of energizing sources are coupled respectively to said first and second capacitance means by respective first and second resistance means.

6. A drive circuit for a kinescope deflection output transistor in accordance with claim 5, wherein said unidirectional current conducting means comprises rectifier means coupling said second capacitance means to said first capacitance means.

7. A drive circuit for a kinescope deflection output transistor comprising:
   drive transformer means including a secondary winding coupled with a base-emitter junction of the output transistor and also including a primary winding;
   driver switch means serially coupled with said primary winding of said drive transformer means thereby forming a switched winding;
   first capacitance means coupled to said switched winding;
   a first source of energizing potential;
   first resistance means coupling said first source of energizing potential to said first capacitance means for energy charging thereof;
   second capacitance means;
   unidirectional current conducting means coupled to said first and second energy storage means for providing energy flow therebetween;
   a second source of energizing potential having a magnitude substantially less than that of said first energizing potential, second resistance means coupling said second source of energizing potential to said second capacitance means for energy charging thereof, wherein said second resistance means has a resistance substantially less than that of said first resistance means.

8. A drive circuit for a kinescope deflection output transistor in accordance with claim 7, wherein said unidirectional current conducting means comprises diode means coupling said second capacitance means to said first capacitance means.

9. A drive circuit for a kinescope deflection output transistor in accordance with claim 8, wherein said coupling of said second capacitance means to said first capacitance means occurs when the voltage across said first capacitance means is substantially equal to that across said second capacitance means.

* * * * *